(12) United States Patent
Yang et al.

(10) Patent No.: US 9,412,885 B2
(45) Date of Patent: Aug. 9, 2016

(54) SOLAR CELL

(71) Applicant: LG ELECTRONICS INC., Seoul (KR)

(72) Inventors: Juhong Yang, Seoul (KR); Jinah Kim, Seoul (KR); Jeongbeom Nam, Seoul (KR); Dohwan Yang, Seoul (KR); Indo Chung, Seoul (KR); Ilhyoung Jung, Seoul (KR); Hyungjin Kwon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/861,789

(22) Filed: Sep. 22, 2015

(65) Prior Publication Data

US 2016/0013330 A1  Jan. 14, 2016

Related U.S. Application Data

(63) Continuation of application No. 13/546,940, filed on Jul. 11, 2012, now Pat. No. 9,166,082.

(30) Foreign Application Priority Data

Jul. 29, 2011 (KR) ........................ 10-2011-0075680

(51) Int. Cl.
*H01L 31/0236* (2006.01)
*H01L 31/068* (2012.01)
(Continued)

(52) U.S. Cl.
CPC .... *H01L 31/02168* (2013.01); *H01L 31/02363* (2013.01); *H01L 31/02366* (2013.01);
(Continued)

(58) Field of Classification Search
CPC ............ H01L 31/068; H01L 31/02168; H01L 31/02363; H01L 31/182; H01L 31/0236
See application file for complete search history.

(56) References Cited

U.S. PATENT DOCUMENTS

| 2004/0152326 A1 | 8/2004 | Inomata |
| 2006/0225775 A1 | 10/2006 | Ishihara |
| 2010/0000597 A1 | 1/2010 | Cousins |
| 2010/0193031 A1 | 8/2010 | Stoddard |

(Continued)

FOREIGN PATENT DOCUMENTS

| CN | 101796226 A | 8/2010 |
| EP | 1753032 A1 | 2/2007 |

(Continued)

OTHER PUBLICATIONS

MacDonald et al., "Texturing industrial multicrystalline silicon solar cells", Solar Energy, vol. 76, 2004, pp. 277-283, XP004481468.

*Primary Examiner* — Marla D McConnell
(74) *Attorney, Agent, or Firm* — Birch, Stewart, Kolasch & Birch, LLP (57) ABSTRACT

A solar cell can include a substrate of a first conductive type; an emitter region of a second conductive type opposite the first conductive type and which forms a p-n junction along with the substrate; an anti-reflection layer positioned on the emitter region; a front electrode part electrically connected to the emitter region; and a back electrode part electrically connected to the substrate, wherein the substrate including a first area formed of single crystal silicon and a second area formed of polycrystalline silicon, wherein a thickness of the anti-reflection layer positioned on the first area is less than a thickness of the anti-reflection layer positioned on the second area, wherein a roughness of an incident surface of the substrate in the first area is different from a roughness of the incident surface of the substrate in the second area, and wherein the emitter region is entirely formed on the incident surface of the substrate.

20 Claims, 5 Drawing Sheets

(51) Int. Cl.
  *H01L 31/0216* (2014.01)
  *H01L 31/18* (2006.01)
  *H01L 31/0368* (2006.01)
  *H01L 31/0352* (2006.01)

(52) U.S. Cl.
  CPC .. *H01L31/03682* (2013.01); *H01L 31/035272* (2013.01); *H01L 31/068* (2013.01); *H01L 31/182* (2013.01); *Y02E 10/546* (2013.01); *Y02E 10/547* (2013.01)

(56) References Cited

U.S. PATENT DOCUMENTS

2011/0100424 A1   5/2011   Roche et al.
2011/0126877 A1   6/2011   Kim et al.

FOREIGN PATENT DOCUMENTS

| JP | 2005-327871 A | 11/2005 |
| KR | 10-2005-0087248 A | 8/2005 |
| KR | 10-2011-0064004 A | 6/2011 |

SOLAR CELL

CROSS REFERENCE TO RELATED APPLICATIONS

This application is a continuation of application Ser. No. 13/546,940 filed on Jul. 11, 2012, which claims priority to and the benefit of Korean Patent Application No. 10-2011-0075680 filed in the Korean Intellectual Property Office on Jul. 29, 2011. The entire contents of these applications are incorporated herein by reference.

BACKGROUND OF THE INVENTION

1. Field of the Invention

Embodiments of the invention relate to a solar cell.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, carriers including electrons and holes are produced in the semiconductor parts. The carriers move to the n-type semiconductor part and the p-type semiconductor part under the influence of the p-n junction. Namely, the electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

SUMMARY OF THE INVENTION

In one aspect, there is a solar cell including a substrate of a first conductive type, an emitter region of a second conductive type opposite the first conductive type and which forms a p-n junction along with the substrate, an anti-reflection layer positioned on the emitter region, a front electrode part electrically connected to the emitter region, and a back electrode part electrically connected to the substrate, wherein the substrate includes a first area formed of single crystal silicon and a second area formed of polycrystalline silicon, and wherein a thickness of the anti-reflection layer positioned in the first area is less than a thickness of the anti-reflection layer positioned in the second area.

The thickness of the anti-reflection layer positioned in the first area may be about 60% to 80% of the thickness of the anti-reflection layer positioned in the second area.

An incident surface of the substrate in the first area may includes a plurality of uneven portions each having a pyramid shape, and an incident surface of the substrate in the second area may not include an uneven portion having a pyramid shape. A distance between upper vertexes of the plurality of uneven portions of the pyramid shape in the first area of the substrate may be equal to or less than about 3 μm, and a height of each of the plurality of uneven portions of the pyramid shape may be equal to or less than about 4 μm.

An incident surface of the emitter region in the first area of the substrate may include a plurality of uneven portions each having a pyramid shape, and an incident surface of the emitter region in the second area of the substrate may not include an uneven portion having a pyramid shape. A thickness of the emitter region in the first area of the substrate may be substantially equal to a thickness of the emitter region in the second area of the substrate.

An incident surface of the anti-reflection layer in the first area of the substrate may include a plurality of uneven portions each having a pyramid shape, and an incident surface of the anti-reflection layer in the second area of the substrate may not include an uneven portion having a pyramid shape.

The anti-reflection layer may include a first anti-reflection layer, which is positioned directly on the emitter region, and a second anti-reflection layer, which is positioned directly on the first anti-reflection layer.

The anti-reflection layer in the first area may have a thickness of about 70 nm to 110 nm, and the anti-reflection layer in the second area may have a thickness of about 100 nm to 140 nm.

A thickness of the first anti-reflection layer in the first area may be about 30 nm to 50 nm, and a thickness of the second anti-reflection layer in the first area may be about 40 nm to 60 nm and is greater than the thickness of the first anti-reflection layer in the first area. A thickness of the first anti-reflection layer in the second area may be about 40 nm to 60 nm, and a thickness of the second anti-reflection layer in the second area may be about 60 nm to 80 nm.

A refractive index of the first anti-reflection layer in the first area may be substantially equal to a refractive index of the first anti-reflection layer in the second area, and a refractive index of the second anti-reflection layer in the first area may be substantially equal to a refractive index of the second anti-reflection layer in the second area.

The refractive index of the first anti-reflection layer may be greater than the refractive index of the second anti-reflection layer. For example, the refractive index of the first anti-reflection layer may be about 2.1 to 2.3, and the refractive index of the second anti-reflection layer may be about 1.75 to 1.9.

The anti-reflection layer may be formed of silicon nitride.

The first anti-reflection layer and the second anti-reflection layer may be formed of silicon nitride.

The second area of the substrate may be flatter than the first area of the substrate.

An incident surface of the emitter region positioned in the second area of the substrate may be flatter than an incident surface of the emitter region positioned in the first area of the substrate. An incident surface of the anti-reflection layer positioned in the second area of the substrate may be flatter than an incident surface of the anti-reflection layer positioned in the first area of the substrate.

The front electrode part may be formed on the first area and the second area.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It should be noted that a detailed description of known arts will be omitted if the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may be not on a portion of an edge of the other element.

Example embodiments of the invention will be described with reference to FIGS. 1 to 5.

A solar cell according to an example embodiment of the invention is described in detail with reference to FIGS. 1 and 2.

Figure 1:
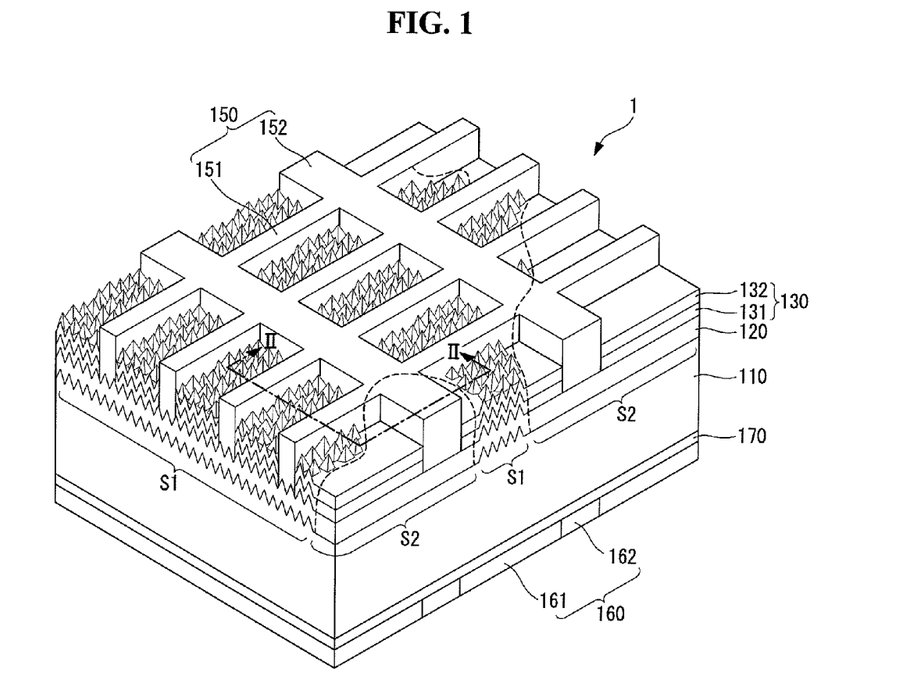
FIG. 1 is a partial perspective view of a solar cell according to an example embodiment of the invention.
Figure 2:
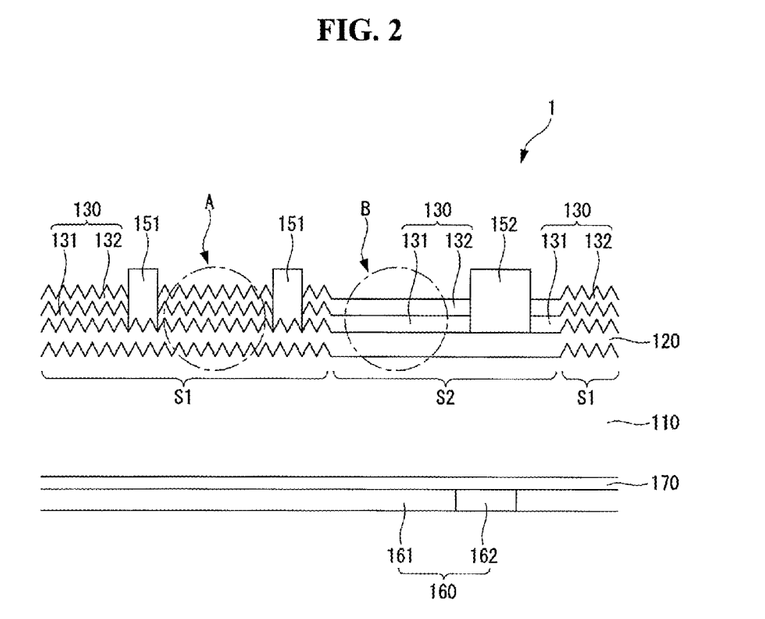
FIG. 2 is a cross-sectional view taken along line II-II of FIG. 1.

FIG. 1 is a partial perspective view of a solar cell according to an example embodiment of the invention, and FIG. 2 is a cross-sectional view taken along line II-II of FIG. 1.

As shown in FIGS. 1 and 2, a solar cell 1 according to an example embodiment of the invention may include a substrate 110, an emitter region 120 positioned at a front surface of the substrate 110 on which light is incident, an anti-reflection layer 130 positioned on the emitter region 120, a back surface field region 170 positioned at a back surface of the substrate 110, a front electrode part 150 positioned on the emitter region 120, and a back electrode part 160 positioned on the back surface of the substrate 110. In another embodiment, the back surface field region 170 may be omitted, if necessary or desired.

The substrate 110 may contain impurities of a first conductive type, for example, p-type impurities.

When the substrate 110 is of a p-type, the substrate 110 may contain impurities of a group III element such as boron (B), gallium (Ga), and indium (In). Alternatively, the substrate 110 may be of an n-type and/or may be formed of a semiconductor material other than silicon. When the substrate 110 is of the n-type, the substrate 110 may contain impurities of a group V element such as phosphorus (P), arsenic (As), and antimony (Sb).

When light irradiated onto the solar cell 1 is incident on the substrate 110, electron-hole pairs are produced by light energy based on the incident light.

The substrate 110 includes a first area (or a first portion) S1 formed of single crystal silicon and a second area (or a second portion) S2 formed of polycrystalline silicon. When a texturing process is performed on the incident surface (i.e., the front surface) of the substrate 110, crystal orientations of the first area S1 (i.e., the single crystal silicon area) are uniform, and thus a plurality of uneven portions each having a pyramid shape are formed in the first area S1. On the other hand, crystal orientations of the second area S2 (i.e., the polycrystalline silicon area) are not uniform, and thus, a plurality of uneven portions having not a uniform pattern (for example, a pyramid shape) but a non-uniform pattern are formed in the second area S2. Heights of the uneven portions in the second area S2 are much less than heights of the uneven portions in the first area S1. Thus, the second area S2 has an almost flat surface, as compared to the first area S1. This will be described in detail later with reference to FIG. 3.

The emitter region 120 is entirely formed at the front surface (or the incident surface) of the substrate 110. The emitter region 120 is a region doped with impurities of a second conductive type (for example, the n-type) opposite the first conductive type of the substrate 110. Thus, the emitter region 120 of the second conductive type forms a p-n junction along with a first conductive type region of the substrate 110.

The electrons and the holes produced by light incident on the substrate 110 respectively move to the n-type semiconductor and the p-type semiconductor by a built-in potential difference resulting from the p-n junction between the substrate 110 and the emitter region 120. Thus, when the substrate 110 is of the p-type and the emitter region 120 is of the n-type, the holes move to the substrate 110 and the electrons move to the emitter region 120.

Because the emitter region 120 forms the p-n junction along with the substrate 110, the emitter region 120 may be of the p-type if the substrate 110 is of the n-type in another embodiment. In this instance, the holes may move to the emitter region 120, and the electrons may move to the substrate 110.

When the emitter region 120 is of the n-type, the emitter region 120 may be formed by doping the substrate 110 with impurities of a group V element such as phosphorus (P), arsenic (As), and antimony (Sb). Alternatively, when the emitter region 120 is of the p-type, the emitter region 120 may be formed by doping the substrate 110 with impurities of a group III element such as boron (B), gallium (Ga), and indium (In).

As shown in FIGS. 1 and 2, an incident surface of the emitter region 120 positioned in the first area S1 has a plurality of uneven portions each having a pyramid shape in conformity with the shapes of the plurality of uneven portions formed on the incident surface of the substrate 110 in the first area S1. Further, an incident surface of the emitter region 120 positioned in the second area S2 does not have uneven portions having the pyramid shape in conformity with the shape of the incident surface of the substrate 110 in the second area S2. Thus, the incident surface of the emitter region 120 in the second area S2 is flatter or more even than the incident surface of the emitter region 120 in the first area S1.

The anti-reflection layer 130 prevents light incident from the outside from being again reflected to the outside. The anti-reflection layer 130 is formed on a front surface of the emitter region 120. More specifically, the anti-reflection layer 130 may be formed on the front surface of the emitter region 120, on which the front electrode part 150 is not formed.

The anti-reflection layer 130 may be formed of a transparent material, for example, hydrogenated silicon nitride (SiNx:H), hydrogenated silicon oxide (SiOx:H), or hydrogenated silicon oxynitride (SiOxNy:H).

The anti-reflection layer 130 reduces a reflectance of light incident on the solar cell 1 and increases selectivity of a predetermined wavelength band, thereby increasing the efficiency of the solar cell 1.

The anti-reflection layer 130 performs a passivation function which converts a defect, for example, dangling bonds existing at and around the surface of the emitter region 120 into stable bonds using hydrogen (H) used to form the anti-reflection layer 130 to thereby prevent or reduce a recombination and/or a disappearance of carriers moving to the surface of the emitter region 120. Hence, the efficiency of the solar cell 1 is improved.

As shown in FIGS. 1 and 2, an incident surface of the anti-reflection layer 130 positioned in the first area S1 has a plurality of uneven portions each having a pyramid shape in conformity with the shapes of the plurality of uneven portions formed on the incident surface of the substrate 110 in the first area S1. Further, an incident surface of the anti-reflection layer 130 positioned in the second area S2 does not have uneven portions having the pyramid shape in conformity with the shape of the incident surface of the substrate 110 in the second area S2. Thus, the incident surface of the anti-reflection layer 130 in the second area S2 is flatter or more even than the incident surface of the anti-reflection layer 130 in the first area S1.

A thickness of the anti-reflection layer 130 in the first area S1 of the substrate 110 may be different from a thickness of the anti-reflection layer 130 in the second area S2 of the substrate 110 because of a difference between surface areas of the incident surface of the substrate 110 per a unit surface area of the substrate 110. Namely, the thickness of the anti-reflection layer 130 in the first area S1 may be less than the thickness of the anti-reflection layer 130 in the second area S2. This will be described in detail later with reference to FIG. 4.

In the embodiment of the invention, the anti-reflection layer 130 has a multi-layered structure, including for example, a double-layered structure. Alternatively, the anti-reflection layer 130 may have a single-layered structure.

In the embodiment of the invention, the anti-reflection layer 130 has a double-layered structure including a first anti-reflection layer 131 and a second anti-reflection layer 132. The first anti-reflection layer 131 abuts on the emitter region 120 and is positioned directly on the emitter region 120. The second anti-reflection layer 132 abuts on the first anti-reflection layer 131 and is positioned directly on the first anti-reflection layer 131.

A refractive index of the first anti-reflection layer 131 may be greater than a refractive index of the second anti-reflection layer 132. For example, the refractive index of the first anti-reflection layer 131 may be about 2.1 to 2.3, and the refractive index of the second anti-reflection layer 132 may be about 1.75 to 1.9.

The first anti-reflection layer 131 may be formed of silicon nitride (SiNx), for example. The first anti-reflection layer 131 performs the passivation function that converts a defect, for example, dangling bonds existing at and around the surface of the emitter region 120 into stable bonds to thereby prevent or reduce a recombination and/or a disappearance of carriers moving to the emitter region 120. Further, the first anti-reflection layer 131 reduces a reflectance of light incident on the substrate 110. The first anti-reflection layer 131 has the refractive index of about 2.1 to 2.3.

When the refractive index of the first anti-reflection layer 131 is less than about 2.1, an anti-reflection operation of the first anti-reflection layer 131 is not well performed because of a smooth reflection of light. Hence, the passivation effect of the first anti-reflection layer 131 is reduced, and the efficiency of the solar cell 1 is reduced. When the refractive index of the first anti-reflection layer 131 is greater than about 2.3, the photoelectric efficiency of the substrate 110 is reduced because light incident on the substrate 110 is absorbed in the first anti-reflection layer 131.

The second anti-reflection layer 132 is positioned only on the first anti-reflection layer 131. The second anti-reflection layer 132 may be formed of silicon nitride (SiNx) in the same manner as the first anti-reflection layer 131. The second anti-reflection layer 132 has the refractive index of about 1.75 to 1.9.

The first and second anti-reflection layers 131 and 132 reduce a reflectance of light incident on the substrate 110 and increase an amount of light absorbed in the substrate 110. Further, the second anti-reflection layer 132 further improves the passivation effect due to hydrogen (H) contained in silicon nitride (SiNx).

As described above, the refractive index of the second anti-reflection layer 132 is less than the refractive index of the first anti-reflection layer 131. Therefore, the anti-reflection effect of the second anti-reflection layer 132 may be better than the first anti-reflection layer 131, but the passivation effect of the second anti-reflection layer 132 may be poorer than the first anti-reflection layer 131.

When the refractive index of the second anti-reflection layer 132 is less than about 1.75, an anti-reflection operation of the second anti-reflection layer 132 is not well performed because of a smooth reflection of light. When the refractive index of the second anti-reflection layer 132 is greater than about 1.9, the photoelectric efficiency of the substrate 110 is reduced because light incident on the substrate 110 is absorbed in the second anti-reflection layer 132.

As shown in FIG. 1, the front electrode part 150 includes a plurality of finger electrodes 151 and a plurality of front bus bars 152 crossing the finger electrodes 151. The front electrode part 150 is formed on the front surface of the emitter region 120 and is electrically connected to the emitter region 120. Alternatively, the plurality of front bus bars 152 may be omitted in another embodiment.

The finger electrodes 151 and the front bus bars 152 are connected to each other. The finger electrodes 151 are separated from one another and extend parallel to one another in a fixed direction. Further, the front bus bars 152 are separated from one another and extend parallel to one another in a fixed direction. The finger electrodes 151 and the front bus bars 152 collect carriers (for example, electrons) moving to the emitter region 120.

The front bus bars 152 are positioned on the same level layer as the finger electrodes 151 and are electrically and physically connected to the finger electrodes 151 at crossings of the finger electrodes 151 and the front bus bars 152.

As shown in FIG. 1, the plurality of finger electrodes 151 may be disposed in a stripe shape extending in a transverse or longitudinal direction, and the plurality of front bus bars 152 may be disposed in a stripe shape extending in a longitudinal or transverse direction. Thus, the front electrode part 150 may have a lattice shape on the front surface of the substrate 110.

The front bus bars 152 collect not only carriers (for example, electrons) moving from the emitter region 120 but also carriers collected by the finger electrodes 151 crossing the front bus bars 152, and move the collected carriers in a desired direction. Thus, a width of each front bus bar 152 may be greater than a width of each finger electrode 151.

The front bus bars 152 are connected to an external device and output the collected carriers to the external device. The front electrode part 150 including the finger electrodes 151 and the front bus bars 152 is formed of at least one conductive material such as silver (Ag).

In the embodiment of the invention, the number of finger electrodes 151 and the number of front bus bars 152 may vary, if necessary or desired. In embodiments of the invention, the front electrode part 150 including the plurality of finger electrodes 151 and/or a plurality of front bus bars 152 may be formed at least on the first area S1 and the second area S2. For example, the front electrode part 150 may be formed on both the first area S1 and the second area S2.

The back surface field region 170 is a region (for example, a $p^+$-type region) that is more heavily doped than the substrate 110 with impurities of the same conductive type as the substrate 110.

A potential barrier is formed by a difference between impurity concentrations of the first conductive type region (for example, a p-type region) of the substrate 110 and the back surface field region 170. Hence, the potential barrier prevents or reduces electrons from moving to the back surface field region 170 used as a moving path of holes and makes it easier for the holes to move to the back surface field region 170. Thus, the back surface field region 170 reduces an amount of carriers lost by a recombination and/or a disappearance of electrons and holes at and around the back surface of the substrate 110 and accelerate a movement of desired carriers (for example, holes), thereby increasing an amount of carriers moving to the back electrode part 160.

As shown in FIG. 1, the back electrode part 160 positioned on the back surface of the substrate 110 includes a back electrode 161 and a plurality of back bus bars 162. In another embodiment, the back bus bars 162 may be omitted, if necessary or desired.

The back electrode 161 contacts the back surface field region 170 positioned at the back surface of the substrate 110 and is positioned on the entire back surface of the substrate 110 except a formation area of the back bus bars 162. In another embodiment, the back electrode 161 may be not positioned at an edge of the back surface of the substrate 110. The back electrode 161 is formed of at least one conductive material such as aluminum (Al).

The back electrode 161 collects carriers (for example, holes) moving to the back surface field region 170.

Because the back electrode 161 contacts the back surface field region 170 having the impurity concentration higher than the substrate 110, a contact resistance between the substrate 110 (i.e., the back surface field region 170) and the back electrode 161 is reduced. Hence, the transfer efficiency of carriers from the substrate 110 to the back electrode 161 is improved.

The back bus bars 162 are positioned on the back surface of the substrate 110, on which the back electrode 161 is not positioned, and are connected to the back electrode 161. The back bus bars 162 and the back electrode 161 are positioned on the same level layer on the back surface of the substrate 110.

The back bus bars 162 collect carriers transferred from the back electrode 161 in the same manner as the front bus bars 152.

The back bus bars 162 are connected to the external device, and carriers (for example, holes) collected by the back bus bars 162 are output to the external device.

The back bus bars 162 may be formed of a material having better conductivity than the back electrode 161. For example, the back bus bars 162 may contain at least one conductive material such as silver (Ag), unlike the back electrode 161.

The back bus bars 162 extend parallel to one another in the same direction as an extension direction of the front bus bars 152 and are separated from one another. The back bus bars 162 are positioned opposite the front bus bars 152 with the substrate 110 interposed therebetween. In the embodiment of the invention, the number of back bus bars 162 may be equal to the number of front bus bars 152, and may be aligned.

For example, the back bus bars 162 may have a stripe shape in a direction parallel to the front bus bars 152.

An operation of the solar cell 1 having the above-described structure is described below.

When light irradiated to the solar cell 11 is incident on the emitter region 120 and the substrate 110, each of which is the semiconductor part, through the anti-reflection layer 130, electrons and holes are generated in the emitter region 120 and the substrate 110 by light energy produced based on the incident light. In this instance, because a reflection loss of the light incident on the substrate 110 is reduced by the anti-reflection layer 130, an amount of light incident on the substrate 110 increases.

The electrons move to the n-type emitter region 120 and the holes move to the p-type substrate 110 by the p-n junction of the substrate 110 and the emitter region 120.

The electrons moving to the emitter region 120 are collected by the finger electrodes 151 and the front bus bars 152, and then move along the front bus bars 152. The holes moving to the substrate 110 are collected by the back electrode 161 and the back bus bars 162, and then move along the back bus bars 162. When the front bus bars 152 are connected to the back bus bars 162 using electric wires, current flows therein to thereby enable use of the current for electric power.

Figure 3:
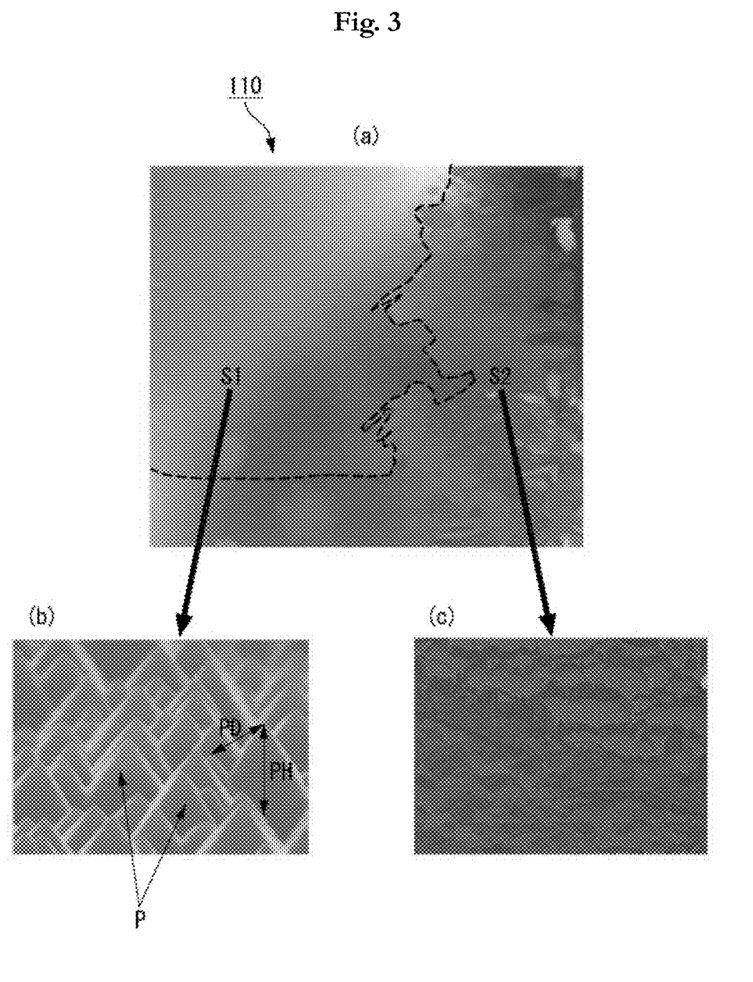
FIG. 3 illustrates in detail a substrate of the solar cell shown in FIGS. 1 and 2.

FIG. 3 illustrates in detail a substrate of the solar cell shown in FIGS. 1 and 2.

In FIG. 3, (a) illustrates the incident surface of the substrate 110 after the texturing process is performed; (b) is an enlarged view of the first area S1 (i.e., the single crystal silicon area) in the incident surface of the substrate 110; and (c) is an enlarged view of the second area S2 (i.e., the polycrystalline silicon area) in the incident surface of the substrate 110.

As shown in (a) of FIG. 3, the substrate 110 according to the embodiment of the invention includes the first area S1 (i.e., the single crystal silicon area) and the second area S2 (i.e., the polycrystalline silicon area).

More specifically, as shown in (a) of FIG. 3, formation positions and formation sizes of the first area S1 and the second area S2 in the substrate 110 may be randomly determined without a specific pattern and rule.

As shown in (b) of FIG. 3, when the texturing process is performed on the incident surface of the substrate 110, the first area S1 of the substrate 110 may have a plurality of uneven portions each having a pyramid shape.

A distance PD between upper vertexes of the uneven portions P having the pyramid shape formed in the first area S1 of the substrate 110 may be equal to or less than about 3 μm. A height PH of each uneven portion P may be equal to or less than about 4 μm.

As shown in (c) of FIG. 3, after the texturing process was performed on the incident surface of the substrate 110, in the second area S2, a plurality of relatively almost flat uneven portions having a non-uniform and random pattern may be formed, a plurality of uneven portions having a uniform pattern (for example, a pyramid shape) may be not formed in the second area S2. Because the crystal orientations of the second area S2 of the substrate 110 are not uniform because of the properties of polycrystalline silicon. Even if the uneven portions are formed in the second area S2, heights of the uneven portions in the second area S2 may be much less than the heights of the uneven portions in the first area S1. Thus, the second area S2 may have the relatively almost flat surface having the non-uniform shape, as compared to the first area S1.

The surface area of the first area S1 is greater than the surface area of the second area S2 based on a unit area, for example, 1 μm² of the substrate 110 including the first and second areas S1 and S2.

The substrate 110 including the first area S1 (i.e., the single crystal silicon area) and the second area S2 (i.e., the polycrystalline silicon area) has better characteristics than a substrate formed only of polycrystalline silicon. Namely, the substrate 110 has a bulk lifetime of carriers longer than the polycrystalline silicon substrate and is cheaper than the polycrystalline silicon substrate.

The solar cell 1 according to the embodiment of the invention may use more carriers generated inside the substrate 110 than around the surface of the substrate 110 through the substrate 110 having the above-described structure.

In other words, because the solar cell 1 according to the embodiment of the invention may use carriers generated inside the substrate 110, the substrate 110 may further increase an amount of current generated in the solar cell 1 than a solar cell of only the polycrystalline silicon substrate. Hence, the efficiency of the solar cell 1 may be improved.

As described above, because the solar cell 1 according to the embodiment of the invention includes the substrate 110 including the first and second areas S1 and S2, the thickness of the anti-reflection layer 130 positioned on the front surface of the substrate 110 may vary. This is described in detail with reference to FIG. 4.

Figure 4:
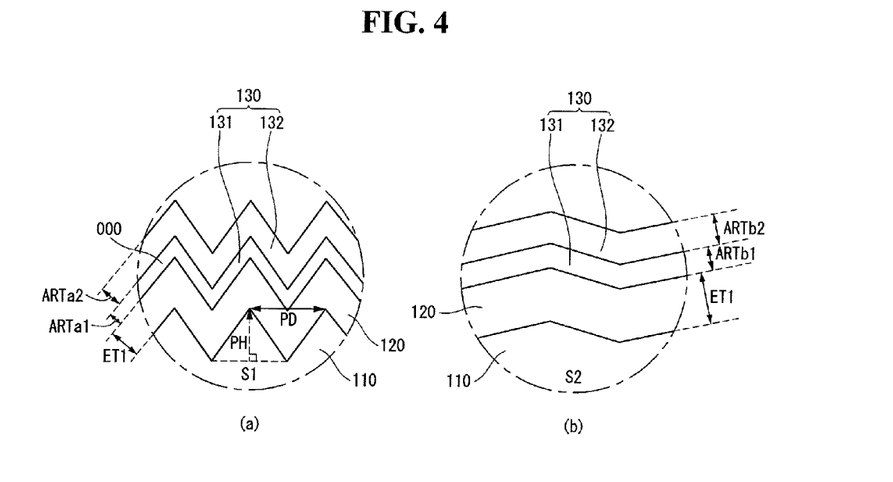
FIG. 4 is an enlarged view of a portion 'A' corresponding to a first area and a portion 'B' corresponding to a second area shown in FIG. 2.

FIG. 4 is an enlarged view of a portion 'A' corresponding to the first area S1 and a portion 'B' corresponding to the second area S2 shown in FIG. 2. In particular, (a) of FIG. 4 is an enlarged view of the portion 'A' corresponding to the first area S1, and (b) of FIG. 4 is an enlarged view of the portion 'B' corresponding to the second area S2.

As shown in (a) and (b) of FIG. 4, the emitter region 120 and the anti-reflection layer 130 are formed on the first area S1 having the uneven portions of the pyramid shape and the second area S2 not having the uneven portions of the pyramid shape.

In this instance, because the second conductive type impurities of the emitter region 120 are diffused and doped into the substrate 110, a thickness ET1 of the emitter region 120 in the first area S1 is substantially equal to a thickness ET1 of the emitter region 120 in the second area S2. However, the incident surface of the emitter region 120 on the first area S1 has a plurality of uneven portions each having the pyramid shape in conformity with the shapes of the uneven portions formed on the incident surface of the substrate 110 in the first area S1. Further, the incident surface of the emitter region 120 on the second area S2 does not have uneven portions of the pyramid shape in conformity with the shape of the incident surface of the substrate 110 in the second area S2. Thus, the incident surface of the emitter region 120 in the second area S2 is flatter or more even than the incident surface of the emitter region 120 in the first area S1.

As a result, the surface area of the emitter region 120 in the first area S1 is greater than the surface area of the emitter region 120 in the second area S2 based on the unit area of the substrate 110.

The formation material of the anti-reflection layer 130 is distributed and stacked on the emitter region 120. In this instance, an amount of formation material of the anti-reflection layer 130 distributed on the emitter region 120 in the first area S1 is substantially equal to an amount of formation material of the anti-reflection layer 130 distributed on the emitter region 120 in the second area S2 based on the unit area of the substrate 110.

However, a thickness of the anti-reflection layer 130 formed in the first area S1 of the substrate 110 is less than a thickness of the anti-reflection layer 130 formed in the second area S2 of the substrate 110 because of a difference between the surface areas of the first area S1 and the second area S2.

In this instance, if the total thickness of the anti-reflection layer 130 is determined based on the first area S1, the anti-reflection layer 130 formed in the second area S2 may be excessively thick because of a difference between the thicknesses of the anti-reflection layer 130 formed in the first area S1 and the second area S2. Further, if the total thickness of the anti-reflection layer 130 is determined based on the second area S2, the anti-reflection layer 130 formed in the first area S1 may be excessively thin because of the difference between the thicknesses of the anti-reflection layer 130 formed in the first area S1 and the second area S2.

Hence, an optical loss may be generated or the passivation effect may be reduced. As a result, the photoelectric conversion efficiency of the solar cell 1 may be better than that of the solar cell including the polycrystalline silicon substrate.

However, as described above with reference to FIG. 3, if light of a long wavelength band capable of generating more carriers inside the substrate 110 than around the surface of the substrate 110 is used in consideration of the relatively long bulk lifetime of carriers, the photoelectric conversion efficiency of the solar cell 1 may be further improved.

The refractive index of the first anti-reflection layer 131 may be set to about 2.1 to 2.3 and the refractive index of the second anti-reflection layer 132 may be set to about 1.75 to 1.9, so as to more efficiently use light of the long wavelength band. In this instance, a refractive index of the anti-reflection layer 130 in the first area S1 and a refractive index of the anti-reflection layer 130 in the second area S2 are set to be substantially equal to each other.

The entire thickness of the anti-reflection layer 130 in the first area S1 may be about 70 nm to 110 nm, and the entire thickness of the anti-reflection layer 130 in the second area S2 may be about 100 nm to 140 nm.

The entire thickness of the anti-reflection layer 130 in the first area S1 may be about 60% to 80% of the entire thickness of the anti-reflection layer 130 in the second area S2 within the above thickness range of the anti-reflection layer 130.

More specifically, a thickness ARTa1 of the first anti-reflection layer 131 in the first area S1 may be about 30 nm to 50 nm, and a thickness ARTa2 of the second anti-reflection layer 132 in the first area S1 may be about 40 nm to 60 nm and may be greater than the thickness ARTa1 of the first anti-reflection layer 131 in the first area S1.

Further, a thickness ARTb1 of the first anti-reflection layer 131 in the second area S2 may be about 40 nm to 60 nm, and a thickness ARTb2 of the second anti-reflection layer 132 in the second area S2 may be about 60 nm to 80 nm and may be greater than the thickness ARTb1 of the first anti-reflection layer 131 in the second area S2.

The solar cell 1 according to the embodiment of the invention sets the refractive indexes and the thicknesses of the first anti-reflection layer 131 and the second anti-reflection layer 132 to the above-described values, thereby reducing a reflectance of light of the long wavelength band of about 700 nm to 1,000 nm and further increasing the photoelectric conversion efficiency of the solar cell 1.

Figure 5:
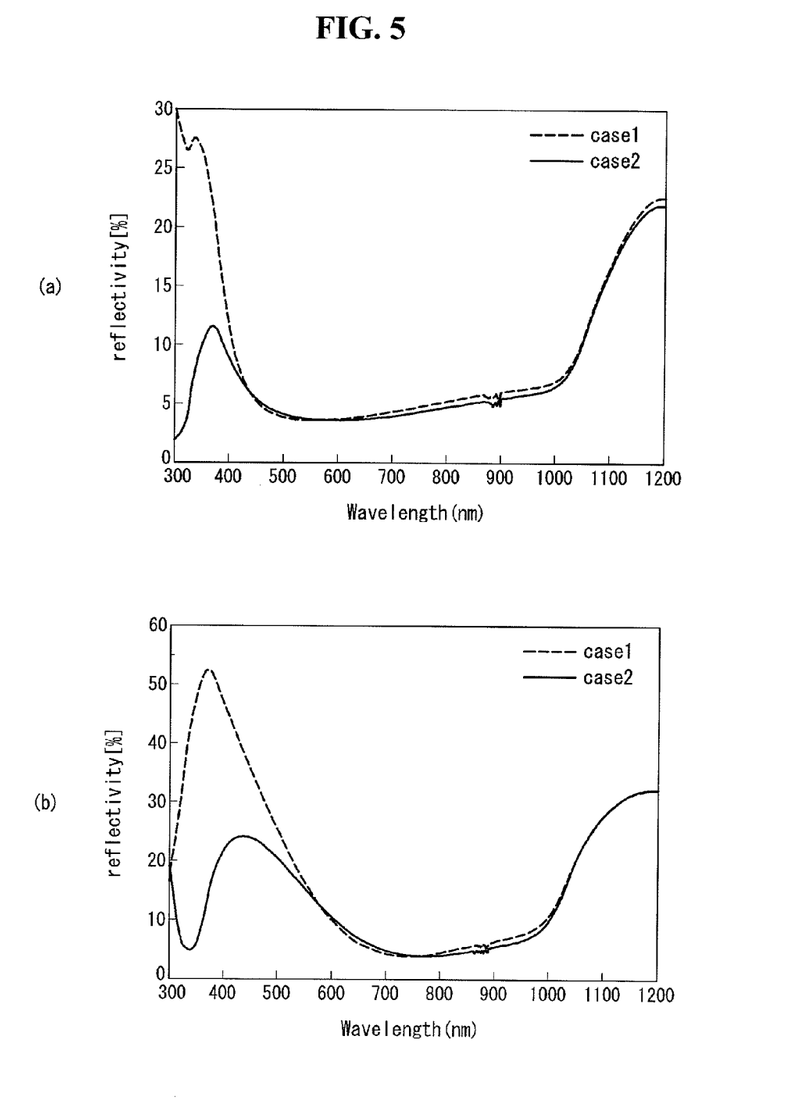
FIG. 5 illustrates a reflectance of an anti-reflection layer depending on a wavelength of light.

FIG. 5 illustrates a reflectance of the anti-reflection layer depending on a wavelength of light.

In FIG. 5, (a) illustrates a reflectance depending on a wavelength of light in the first area S1 of the substrate 110, and (b) illustrates a reflectance depending on a wavelength of light in the second area S2 of the substrate 110.

In (a) and (b) of FIG. 5, 'case1' indicates an example of using the first anti-reflection layer 131 as the anti-reflection layer, and 'case2' indicates an example of using the first and second anti-reflection layers 131 and 132 as the anti-reflection layer.

In (a) and (b) of FIG. 5, the easel used the first anti-reflection layer 131 which has a single-layered structure and a refractive index of about 2.2.

A thickness of the first anti-reflection layer 131 in the first area S1 was set to about 35 nm, and a thickness of the first anti-reflection layer 131 in the second area S2 was set to about 50 nm.

Further, in (a) and (b) of FIG. 5, the case2 used the anti-reflection layer having a double-layered structure. More specifically, a refractive index and a thickness of the first anti-reflection layer 131 used as a lower layer were substantially equal to those of the first anti-reflection layer 131 used in the case1. A refractive index of the second anti-reflection layer 132 positioned on the first anti-reflection layer 131 was set to about 1.8. Further, a thickness of the second anti-reflection layer 132 in the first area S1 was set to about 50.5 nm, and a thickness of the second anti-reflection layer 132 in the second area S2 was set to about 72 nm.

In (a) and (b) of FIG. 5, the refractive indexes and the thicknesses of the single-layered anti-reflection layer of the case1 and the double-layered anti-reflection layer of the case2 were set within the range of the anti-reflection layer 130 according to the embodiment of the invention, so as to increase an absorptance of light of the long wavelength band.

As shown in (a) and (b) of FIG. 5, a reflectance of light of the long wavelength band of about 700 nm to 1,000 nm was equal to or less than about 10% and was good.

Further, a reflectance of the double-layered anti-reflection layer of the case2 was less than a reflectance of the single-layered anti-reflection layer of the case1 in a middle wavelength band less than about 700 nm and a short wavelength band, and thus an absorptance of the double-layered anti-reflection layer of the case2 was further improved.

More specifically, as shown in (a) of FIG. 5, a reflectance of the double-layered anti-reflection layer in the first area S1 of the substrate 110 was much less than a reflectance of the single-layered anti-reflection layer in the first area S1 of the substrate 110 in the short wavelength band equal to or less than about 450 nm. Further, as shown in (b) of FIG. 5, a reflectance of the double-layered anti-reflection layer in the second area S2 of the substrate 110 was much less than a reflectance of the single-layered anti-reflection layer in the second area S2 of the substrate 110 in the middle wavelength band of about 550 nm and the short wavelength band.

As described above, the photoelectric efficiency of the solar cell according to the embodiment of the invention is improved using the substrate including the first area formed of single crystal silicon and the second area formed of polycrystalline silicon, and also the manufacturing cost of the solar cell is greatly reduced. Furthermore, the refractive index and the thickness of the anti-reflection layer are set in consideration of the bulk lifetime of carriers, so as to increase the absorptance of light of the long wavelength band, and thus the photoelectric conversion efficiency of the solar cell is further improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
    a substrate of a first conductive type;
    an emitter region of a second conductive type opposite the first conductive type and which forms a p-n junction along with the substrate;
    an anti-reflection layer positioned on the emitter region;
    a front electrode part electrically connected to the emitter region; and
    a back electrode part electrically connected to the substrate,
    wherein the substrate includes a first area formed of single crystal silicon and a second area formed of polycrystalline silicon,
    wherein a roughness of an incident surface of the substrate in the first area is different from a roughness of the incident surface of the substrate in the second area,
    wherein the emitter region is entirely and directly formed on the incident surface of the substrate,
    wherein the emitter region includes a first area farmed of single crystal silicon and a second area formed of polycrystalline silicon, and
    wherein a thickness of the anti-reflection layer positioned on the first area of the emitter region is less than a thickness of the anti-reflection layer positioned on the second area of the emitter region.

2. The solar cell of claim 1, wherein the thickness of the anti-reflection layer positioned on the first area of the emitter region is 60% to 80% of the thickness of the anti-reflection layer positioned in the second area of the emitter region.

3. The solar cell of claim 1, wherein the incident surface of the substrate in the first area includes a plurality of uneven portions each having a pyramid shape, and the incident surface of the substrate in the second area does not include an uneven portion having a pyramid shape.

4. The solar cell of claim 3, wherein a distance between upper vertexes of the plurality of uneven portions of the pyramid shape in the first area of the substrate is equal to or less than 3 µm, and a height of each of the plurality of uneven portions of the pyramid shape is equal to or less than 4 µm.

5. The solar cell of claim 1, wherein an incident surface of the emitter region on the first area of the substrate includes a plurality of uneven portions each having a pyramid shape, and an incident surface of the emitter region on the second area of the substrate does not include an uneven portion having a pyramid shape.

6. The solar cell of claim 5, wherein a thickness of the emitter region on the first area of the substrate is substantially equal to a thickness of the emitter region on the second area of the substrate.

7. The solar cell of claim 1, wherein an incident surface of the anti-reflection layer on the first area of the substrate includes a plurality of uneven portions each having a pyramid shape, and an incident surface of the anti-reflection layer on the second area of the substrate does not include an uneven portion having a pyramid shape.

8. The solar cell of claim 1, wherein the anti-reflection layer on the first area of the emitter region has a thickness of 70 nm to 110 nm, and the anti-reflection layer on the second area of the emitter region has a thickness of 100 nm to 140 nm.

9. The solar cell of claim 1, wherein the anti-reflection layer includes a first anti-reflection layer, which is positioned on the emitter region, and a second anti-reflection layer, which is positioned on the first anti-reflection layer.

10. The solar cell of claim 9, wherein a thickness of the first anti-reflection layer on the first area of the emitter region is 30 nm to 50 nm, and a thickness of the second anti-reflection layer on the first area of the emitter region is 40 nm to 60 nm and is greater than the thickness of the first anti-reflection layer on the first area of the emitter region.

11. The solar cell of claim 9, wherein a thickness of the first anti-reflection layer on the second area of the emitter region is 40 nm to 60 nm, and a thickness of the second anti-reflection layer on the second area of the emitter region is 60 nm to 80 nm.

12. The solar cell of claim 9, wherein a refractive index of the first anti-reflection layer on the first area of the emitter region is substantially equal to a refractive index of the first anti-reflection layer in the second area of the emitter region, and a refractive index of the second anti-reflection layer on the first area of the emitter region is substantially equal to a refractive index of the second anti-reflection layer on the second area of the emitter region.

13. The solar cell of claim 12, wherein the refractive index of the first anti-reflection layer is greater than the refractive index of the second anti-reflection layer.

14. The solar cell of claim 13, wherein the refractive index of the first anti-reflection layer is 2.1 to 2.3, and the refractive index of the second anti-reflection layer is 1.75 to 1.9.

15. The solar cell of claim 9, wherein the first anti-reflection layer and the second anti-reflection layer are formed of silicon nitride.

16. The solar cell of claim 1, wherein the anti-reflection layer is formed of silicon nitride.

17. The solar cell of claim 1, wherein an overall surface roughness of the second area of the substrate is flatter than an overall surface roughness of the first area of the substrate.

18. The solar cell of claim 1, wherein an overall surface roughness of the emitter region positioned on the second area of the substrate is flatter than an overall surface roughness of the emitter region positioned on the first area of the substrate.

19. The solar cell of claim 1, wherein an overall surface roughness of the anti-reflection layer positioned on the second area of the substrate is flatter than an overall surface roughness of the anti-reflection layer positioned on the first area of the substrate.

20. The solar cell of claim 1, wherein the front electrode part is formed on the first area of the emitter region and the second area of the emitter region.

* * * * *